United States Patent
Beck

(10) Patent No.: US 7,454,241 B2
(45) Date of Patent: Nov. 18, 2008

(54) METHOD FOR CARDIAC MAGNETIC RESONANCE IMAGING

(75) Inventor: Gabriele Marianne Beck, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 120 days.

(21) Appl. No.: 10/569,191

(22) PCT Filed: Aug. 9, 2004

(86) PCT No.: PCT/IB2004/051424
§ 371 (c)(1),
(2), (4) Date: Feb. 22, 2006

(87) PCT Pub. No.: WO2005/022185
PCT Pub. Date: Mar. 10, 2005

(65) Prior Publication Data
US 2006/0293585 A1 Dec. 28, 2006

(30) Foreign Application Priority Data
Aug. 27, 2003 (EP) .................. 03103230

(51) Int. Cl.
*A61B 5/05* (2006.01)
(52) U.S. Cl. ...................................... 600/413
(58) Field of Classification Search ......... 600/410, 600/413, 407, 428, 481, 508, 523
See application file for complete search history.

(56) References Cited

U.S. PATENT DOCUMENTS

| 4,855,910 | A | * | 8/1989 | Bohning | ............... 324/309 |
| 4,961,426 | A | | 10/1990 | Spraggins et al. | ............... 128/853 |
| 5,997,883 | A | * | 12/1999 | Epstein et al. | ............... 324/306 |
| 6,510,337 | B1 | | 1/2003 | Heuscher et al. | ............... 600/428 |
| 6,708,052 | B1 | * | 3/2004 | Mao et al. | ............... 600/407 |
| 2002/0077538 | A1 | * | 6/2002 | Saranathan et al. | ......... 600/410 |
| 2003/0016852 | A1 | | 1/2003 | Kaufmann et al. | ........... 382/131 |

FOREIGN PATENT DOCUMENTS

| EP | 0 269 147 | A2 | 6/1988 |
| EP | 0 273 153 | A2 | 7/1988 |

* cited by examiner

Primary Examiner—Eric F Winakur
Assistant Examiner—Katherine L Fernandez

(57) ABSTRACT

The invention relates to a method for cardiac magnetic resonance imaging. The method comprises the steps of monitoring the ECG of a patient and detecting the occurrence of R-waves ($R_1$, $R_2$, $R_3$) in the ECG, acquiring a plurality of phase encoded MR signals ($a_{1-3}$, $b_{1-3}$, $c_{1-3}$, $d_{1-3}$, $e_{1-3}$) per cardiac cycle by subjecting the patient to a sequence of RF pulses and magnetic field gradient pulses, and reconstructing an MR image from at least a part of the MR signals ($a_{1-3}$, $b_{1-3}$, $c_{1-3}$, $d_{1-3}$, $e_{1-3}$). For providing an improved cardiac MRI method which enables the acquisition and reconstruction of high quality MR images of the heart in cases in which the heart cycle of the examined patient changes over time or is irregular because of arrythmia, the invention proposes that the ECG of the patient is monitored continuously during acquisition of MR signals, wherein MR signals ($d_1$ to $c_1$, $b_2$ to $a_2$, $c_3$ to $b_3$) used for image reconstruction are retrospectively selected depending on the time interval between successive R-waves ($R_1$, $R_2$, $R_3$).

9 Claims, 1 Drawing Sheet

METHOD FOR CARDIAC MAGNETIC RESONANCE IMAGING

The invention relates to a method for cardiac magnetic resonance imaging, the method comprising the following steps:

A) monitoring the ECG of a patient and detecting the occurrence of R-waves in the ECG;

B) acquiring a plurality of phase encoded MR signals per cardiac cycle by subjecting the patient to a sequence of RF pulses and magnetic field gradient pulses;

C) reconstructing an MR image from at least a part of the MR signals acquired in step B).

Furthermore, the invention relates to a device for magnetic resonance imaging for carrying out this method and a computer program for a magnetic resonance imaging device.

In magnetic resonance imaging (MRI) pulse sequences consisting of RF and magnetic field gradient pulses are applied to an object (a patient) to generate magnetic resonance signals which are scanned in order to obtain information therefrom and to reconstruct images of the object. Since its initial development the number of clinical relevant fields of application of MRI has grown enormously. MRI can be applied to almost every part of the body, and it can be used to obtain information about a number of important functions of the human body. The pulse sequence which is applied during a MRI scan determines completely the characteristics the reconstructed images, such as location and orientation in the object, dimensions, resolution, signal-to-noise ratio, contrast, sensitivity for movements, etcetera. An operator of a MRI device has to choose the appropriate sequence and has to adjust and optimize its parameters for the respective application.

In the past, cardiac magnetic resonance imaging methods have been of limited clinical value for several reasons. This is because the heart as a moving object is particularly difficult to image, especially if an imaging plane is set in space with the heart moving in and out of the imaging plane. Cardiac MR imaging is especially difficult since the breathing of the examined patient causes a periodic motion of the heart and other surrounding internal structures of the body of the examined patient. The imaging situation is further complicated by the beating motion of the heart which is added to the breathing motion. Both motions, heart motion and breathing motion, are present during the relatively long period of acquisition of MR signals and cause undesirable artifacts in the resulting images. Image quality may be degraded because of motion blurring for example.

It is known that the beating motion of the heart is fastest during systole and relatively motionless during diastole, in which the heart is fully expanded. Thus, MR images reconstrucred from MR signals acquired during a diastole provide the clearest images of the heart. The breathing motion in turn can be eliminated by simply asking the examined patient to hold his or her breath during the acquisition of MR signals or by acquiring the MR signals during quiet breathing periods.

According to known methods for cardiac MR imaging, such as described for example in the U.S. Pat. No. 2002/0077538 A1, the ECG of the examined patient is monitored in order to synchronize the acquisition of MR signals with the heart cycle. The ECG signal is a repetitive pattern reflecting the electrical activity of the patients heart. Each cardiac cycle begins with a so-called R-wave (highest amplitude peak) in the ECG signal during the systole period and ends with the diastole period almost without any electrical activity. In the mentioned publication it is suggested to monitor the heart rate of the patient prior to the actual image acquisition and to determine a time interval between successive R-waves. This time period obtained from the heart rate monitoring is used to prospectively estimate future intervals between successive R-waves. The acquisition of MR signals can be activated correspondingly such that image data may be obtained during the relatively motionless diastole period.

A major drawback with prospective gating of MR signal acquisition as described above is that such known methods fail to safely determine the time of the diastole if either the heart cycle of the patient changes during image acquisition or the patient simply has an irregular heart beat. For example, the patient's holding of his or her breath during image acquisition may cause a significant change in the heart cycle. It has also to be taken into account in this context that patients subjected to cardiac MR imaging often suffer from cardiovascular disease, and cardiac arrythmia is one frequent symptom of cardiovascular disease. Known cardiac MRI methods fail to produce images without motion artifacts in such cases.

Therefore it is readily appreciated that there is a need for an improved cardiac MRI method which enables the acquisition and reconstruction of high quality MR images of the heart in cases in which the heart cycle of the examined patient changes over time or is irregular because of arrythmia. It is consequently the primary object of the present invention to provide a cardiac MR imaging method which makes sure that in such cases MR signals used for image reconstruction are acquired exclusively during the diastole period.

In accordance with the present invention, a method for cardiac magnetic resonance imaging of the type specified above is disclosed, wherein the ECG of the patient is monitored continuously during acquisition of MR signals in step B), and wherein MR signals used for image reconstruction in step C) are retrospectively selected depending on the time interval between successive R-waves.

The invention enables the reliable generation of high quality cardiac MR images even if the duration of the heart cycle of the examined patient either changes over time or is irregular because of cardiac arrythmia. This is achieved by the continuous monitoring of the ECG during image acquisition. In correspondence with the detection of R-waves in the ECG signal, only those MR signals are selected for image reconstruction which retrospectively appear to have been acquired during the quiet diastole phase of the heart cycle. It is made sure in this way that no MR signals are processed during image reconstruction by which blurring or other motion artifacts due to the beating of the heart would by introduced into the final image. It is important to note in this context that the invention completely avoids the error-prone prospective estimation of the duration of the heart cycle as it is known in the art.

In accordance with the method of the invention it is-useful to acquire the MR signals over a plurality of cardiac cycles or at least over more than one cardiac cycle. With the known imaging sequences of RF pulses and magnetic field gradient pulses it is often not possible to acquire a complete set of MR signals as required for the reconstruction of the desired MR image within a single cardiac cycle. Hence, the proposed method can easily be applied such that MR signals with different phase encoding values used for reconstruction of a single image are acquired during the diastoles of two or more successive heart cycles.

It is known that the heart is in the relatively motionless diastolic phase after a certain delay time after the occurrence of an R-wave. The value of the delay time can be determined according to a general rule which establishes a dependency on the average heart rate. Hence, the delay time is usually adapted according to the average heart rate in conventional prospective gating methods. With the method of the invention, the acquisition of MR signals for each cardiac cycle advantageously begins after a delay period in an early diastolic phase of the cardiac cycle after detection of an R-wave and may continue until the next R-wave is detected. In this way, the effective duration of the acquisition period per cardiac cycle is extended significantly in comparison to conventional prospective gating methods. This is achieved by using a shorter delay period and by continuing the signal acquisition until the detection of the next R-wave. Hence, a maximum of imaging data can be obtained depending on the duration of the individual heart cycle.

The proposed method offers different opportunities to select the optimal signal acquisition interval during the time interval between successive R-waves:

The optimal delay period for an average heart rate may deviate from patient to patient Consequently, MR signals acquired during the diastolic phase can be retrospectively selected in accordance with the method of the invention from a series of MR signal sets acquired with different delay periods.

Alternatively, a further improvement in cases of patients suffering from arrythmia can be achieved in accordance with the method of the invention by generating a histogram of the detected heart rates during a scan and by adapting the delay period if the duration of the interval between successive R-waves deviates from the average heart rate. In this way, the value of the delay period is adjusted in accordance with the actually detected heart rate.

In accordance with the method of the invention, a phase encoding scheme may be applied in step b) such that the phase encoding values of the acquired MR signals are repeated cyclically. The cyclic repetition of phase encoding values facilitates the retrospective selection of an optimum signal acquisition interval. This is because the repetition of phase encoding values makes sure that a complete set of MR signals is available for image reconstruction irrespective of the actual selection of MR signals which is made retrospectively as described above.

The imaging technique of the invention works best if the amplitudes of the individual acquired MR signals are approximately constant. Hence, the method of the invention may advantageously be applied in combination with a so-called steady state acquisition scheme as it is known in the art as such. Preferably, the sequence of RF pulses and magnetic field gradient pulses used for MR signal acquisition may be a balanced turbo field echo (TFE) sequence.

It is easily possible to incorporate the method of the present invention in a dedicated device for magnetic resonance imaging of a body of a patient placed in a stationary and substantially homogeneous main magnetic field. Such an MRI scanner comprises means for establishing the main magnetic field, means for generating magnetic field gradients superimposed upon the main magnetic field, means for radiating RF pulses towards the body, control means for controlling the generation of the magnetic field gradients and the RF pulses, means for receiving and sampling magnetic resonance signals generated by sequences of RF pulses and magnetic field gradient pulses, reconstruction means for forming an image from said signal samples, and means for monitoring the ECG of the patient. In accordance with the invention, the control means, which is usually a microcomputer with a memory and a program control, comprises a programming with a description of an imaging procedure according to the above-described method of the invention.

A computer program adapted for carrying out the imaging procedure of the invention can advantageously be implemented on any common computer hardware, which is presently in clinical use for the control of MRI scanners. The computer program can be provided on suitable data carriers, such as CD-ROM or diskette. Alternatively, it can also be downloaded by a user from an internet server.

The following drawings disclose preferred embodiments of the present invention. It should be understood, however, that the drawings are designed for the purpose of illustration only and not as a definition of the limits of the invention.

In the drawings

Figure 1:
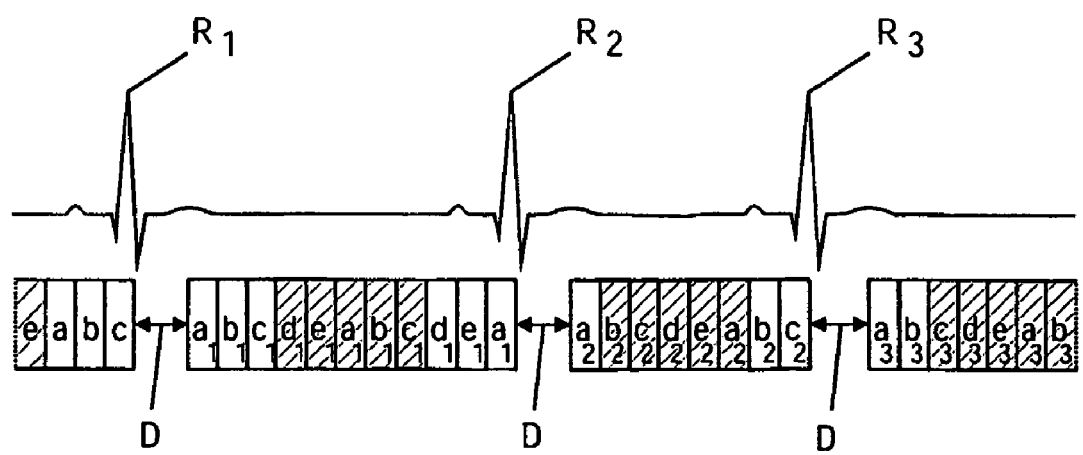
FIG. 1 shows a diagram of the imaging procedure-in accordance with the invention.

FIG. 1 illustrates the cardiac MR imaging method of the invention. The figure shows an ECG signal of a patient with three R-waves designated by $R_1$, $R_2$, and $R_3$. The individual heart cycles are determined by the time intervals between successive R-waves $R_1$, $R_2$, and $R_3$. As can be seen in Fig. 1, the heart cycle of the examined patient changes over time. This irregularity might for example be due to the patient suffering from cardiovascular disease and cardiac arrythmia. In accordance with the invention, the depicted ECG signal is monitored continuously during the acquisition of MR signals, and the R-waves $R_1$, $R_2$, and $R_3$ are detected automatically, for example by means of a computer and an appropriate program which evaluates the digitized ECG signal. The MR signals acquired according to the method of the invention are designated by the letters $a_{1-3}$, $b_{1-3}$, $c_{1-3}$, $d_{1-3}$, and $e_{1-3}$. The letters a, b, c, d, and e represent the cyclically repeated phase encoding values of the MR signals. The sequence of RF pulses and magnetic field gradient pulses used for generation of the MR signals is not shown in the figure. In accordance with the method of the invention, the acquisition of MR signals for each cardiac cycle begins after a delay period D after detection of each R-wave $R_1$, $R_2$, $R_3$. The signal acquisition then continues until the respective next R-wave is detected. MR signals used for image reconstruction are retrospectively selected after 8 signal acquisition depending on the time interval between successive R-waves $R_1$, $R_2$, and $R_3$.

In the depicted case, diagonally hatched MR signals $d_1$ to $c_1$, $b_2$ to $a_2$, and $c_3$ to $b_3$ are selected in accordance with the invention.

Figure 2:
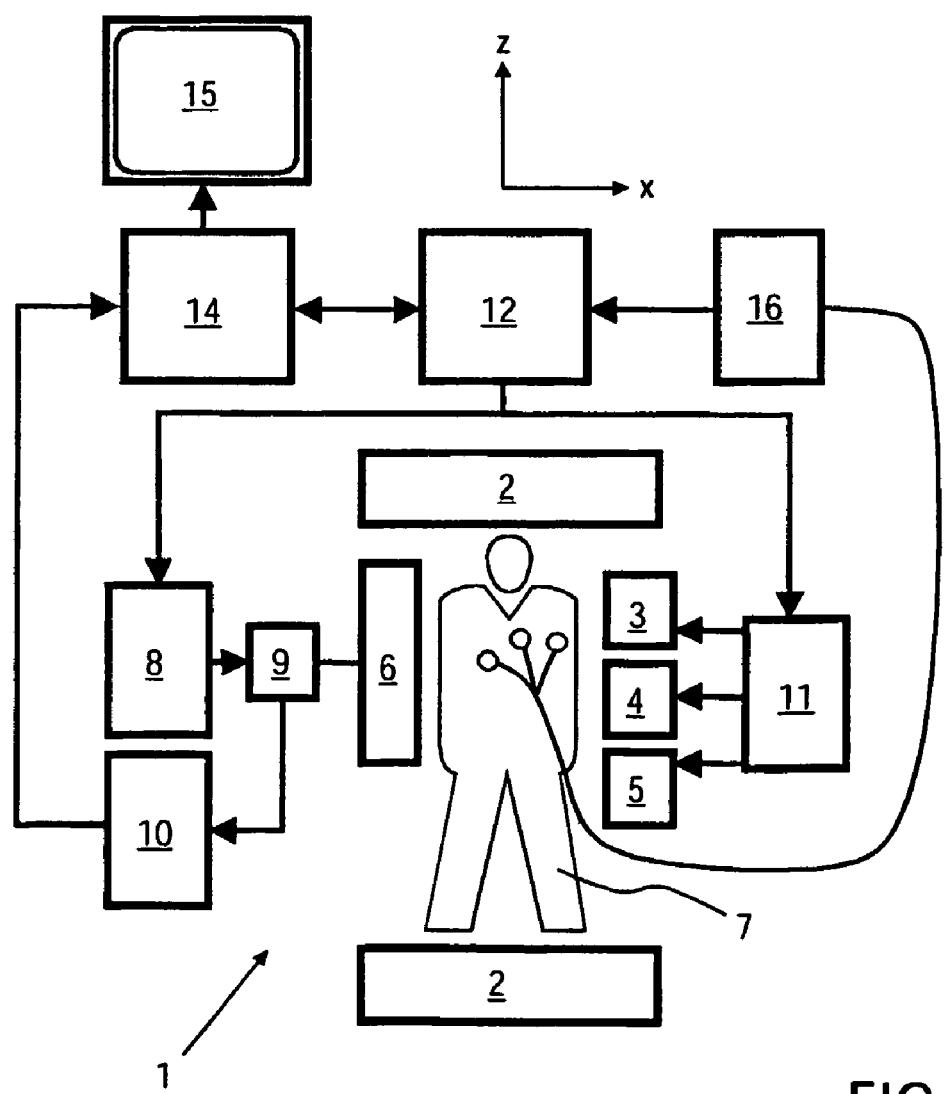
FIG. 2 shows an embodiment of an MRI scanner of the invention.

In Fig. 2 a magnetic resonance imaging device 1 is diagrammatically shown.

The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x-and y-directions. The gradient coils are energized via a power supply 11. The apparatus 1 further comprises a radiation emitter 6, an antenna or coil, for emitting radio frequency (RF) pulses to a body 7, the radiation emitter 6 being coupled to a modulator 8 for generating and modulating the RF pulses. Also provided is a receiver for receiving the MR signals, the receiver can be identical to the emitter 6 or be separate. If the emitter and receiver are physically the same antenna or coil as shown in Fig. 2, a send-receive switch 9 is arranged to separate the received signals from the pulses to be emitted. The received MR signals are input to a demodulator 10. The modulator 8, the emitter 6 and the power supply 11 for the gradient coils 3, 4 and 5 are controlled by a control system 12 to generate the above-described sequence of RF pulses and a corresponding sequence of magnetic field gradient pulses.

The control system is usually a microcomputer with a memory and a program control. For the practical implementation of the invention it comprises a programming with a description of an imaging procedure according to the above-described method. The demodulator 10 is coupled to a data processing unit 14, for example a computer, for transformation of the received echo signals into an image that can be made visible, for example, on a visual display unit 15. There is an ECG means 16 for monitoring the ECG of the patient 7 during acquisition of MR signals, which may be for example a standard digital ECG recording device, connected to the control system 12. The ECG means 16 in turn is connected to the patient 7 via a cable and appropriate electrodes.

The invention claimed is:

1. A method for cardiac magnetic resonance imaging, the method comprising the following steps:
    A) monitoring the ECG of a patient and detecting the occurrence of R-waves in the ECG;
    B) acquiring a plurality of phase encoded MR signals per cardiac cycle by subjecting the patient to a sequence of RF pulses and magnetic field gradient pulses;
    C) reconstructing an MR image from at least a part of the MR signals acquired in step B);
    wherein the ECG of the patient is monitored continuously during acquisition of MR signals in step B), wherein MR signals used for image reconstruction in step C) are retrospectively selected depending on the time interval between successive R-waves;
    wherein the MR signals are acquired over a plurality of cardiac cycles;
    wherein the acquisition of MR signals for each cardiac cycle begins after a delay period in an early diastolic phase of the cardiac cycle after detection of an R-wave and continues until the next R-wave is detected;
    wherein the delay period is adapted in accordance with the actually detected duration of the interval between successive R-waves.

2. The method for cardiac magnetic resonance imaging according to claim 1, wherein MR signals acquired during the diastolic phase are retrospectively selected from a series of MR signal sets acquired with different delay periods.

3. The method for cardiac magnetic resonance imaging according to claim 1, wherein a phase encoding scheme is applied in step B) such that the phase encoding values of the acquired MR signals are repeated cyclically.

4. The method for cardiac magnetic resonance imaging according to claim 1, wherein the sequence of RF pulses and magnetic field gradient pulses is selected such that a steady state acquisition scheme is applied.

5. The method for cardiac magnetic resonance imaging according to claim 4, wherein the sequence of RF pulses and magnetic field gradient pulses is a balanced turbo field echo sequence.

6. A device for magnetic resonance imaging of a body of a patient placed in a stationary and substantially homogeneous main magnetic field, the device comprising means for establishing the main magnetic field, means for generating magnetic field gradients superimposed upon the main magnetic field, means for radiating RF pulses towards the body, control means for controlling the generation of the magnetic field gradients and the RF pulses, means for receiving and sampling MR signals generated by sequences of RF pulses and magnetic field gradient pulses, reconstruction means for forming an image from the signal samples, and means for monitoring the ECG of the patient, wherein the control means is configured to execute an imaging procedure according to a method of claim 1.

7. A digital medium programmed with a program code, the program code being configured to control a computer processor to perform the imaging procedure according to a method of claim 1 to be carried out on a magnetic resonance device.

8. A cardiac MR imaging method which adjusts for cardiac arrhythmia, the method comprising:
    A) estimating a time between the patient's R-wave and a commencement of a next cardiac diastole phase;
    B) selecting a delay period to be less than or equal to the estimated R-wave to diastole phase times;
    C) monitoring a patient's cardiac cycle to detect the occurrence of R-waves in a plurality of the cardiac cycles;
    D) in response to detecting an R-wave, starting the delay period;
    E) after the delay period, applying a field echo magnetic resonance imaging sequence to generate a plurality of phase encoded magnetic resonance signals;
    F) in response to detecting a next R-wave, terminating the generation of magnetic resonance signals;
    G) monitoring a time between adjacent R-waves for a cardiac arrhythmia;
    H) in response to monitoring a cardiac arrhythmia, reducing said delay period;
    I) retrospectively selecting from among the generated magnetic resonance signals, the generated magnetic resonance signals occurring in a preselected chase of the cardiac cycle;
    J) repeating steps D)-I); and
    K) reconstructing the generated magnetic resonance signals into an image representation.

9. A method of magnetic resonance cardiac imaging including:
    A) monitoring a cardiac cycle;
    B) commencing applying RF and gradient pulses a delay period after cardiac R-waves to generate magnetic resonance imaging signals, the delay period being selected dependent on an arrhythmia history;
    C) selecting the magnetic resonance signals generated in a diastolic phase;
    D) adapting the delay period in response to a duration between R-waves deviating from an average heart rate such that applying the RF and gradient pulses commences proximate to an early diastolic phase;
    E) repeating steps A)-D) to collect a set of the magnetic resonance signals generated in the diastolic phase; and,
    F) reconstructing the set magnetic resonance signals generated in the diastolic phase into a diastolic phase cardiac image.

* * * * *